United States Patent
Chen et al.

(10) Patent No.: US 6,492,097 B1
(45) Date of Patent: Dec. 10, 2002

(54) PROCESS FOR INCREASING A LINE WIDTH WINDOW IN A SEMICONDUCTOR PROCESS

(75) Inventors: Anseime Chen, Hsinchu; Chieh-Ming Wang, Hsinchu Hsien; I-Hsiung Huang, Kaohsiung, all of (TW)

(73) Assignee: United Microelectronics Corp., Hsinchu (TW)

( * ) Notice: Subject to any disclaimer, the term of this patent is extended or adjusted under 35 U.S.C. 154(b) by 43 days.

(21) Appl. No.: 09/666,755

(22) Filed: Sep. 21, 2000

(30) Foreign Application Priority Data

Sep. 7, 2000 (TW) ........................................ 89118303 A

(51) Int. Cl.$^7$ ................................................ G03C 5/00
(52) U.S. Cl. ........................... 430/394; 430/396; 430/5; 430/311; 430/322
(58) Field of Search ........................... 430/5, 394, 311, 430/396, 322

(56) References Cited

U.S. PATENT DOCUMENTS 4,504,558 A * 3/1985 Bohlen et al. ................ 430/30
5,242,770 A * 9/1993 Chen et al. .................... 430/5

* cited by examiner

Primary Examiner—John A. McPherson
Assistant Examiner—Daborah Chacko-Davis
(74) Attorney, Agent, or Firm—J. C. Patents

(57) ABSTRACT

A process for increasing the line width window in a semiconductor process, which is suitable to be used to increase the line width widow at the time of the exposure of an iso-line pattern under 0.13 $\mu$m. This process includes: first forming a positive photoresist layer on the base, then using the first photomask to conduct the first exposure step on the positive photoresist layer. The first photomask is designed to have at least one main line that is opaque. On each of the two sides of the main line, there is a scattering bar. The width of the two scattering bars is greater than ⅓ of the wavelength of the light source that is used, and less than the width of the main line. The second photomask is used to conduct the second exposure step on the positive photoresist layer. The second photomask is designed to have at least two iso-lines that are pervious to light, and each of the two iso-lines is located at one of the two positions corresponding to the two scattering bars of the first photomask design. The width of each iso-line is greater than that of the corresponding scattering bar and the distance from each edge of the iso-line to each edge of the corresponding scattering bar is greater than about 60 nm.

10 Claims, 5 Drawing Sheets

PROCESS FOR INCREASING A LINE WIDTH WINDOW IN A SEMICONDUCTOR PROCESS

CROSS-REFERENCE TO RELATED APPLICATION

This application claims the priority benefit of Taiwan application Ser. No. 89118303, filed Sep. 18, 2000.

BACKGROUND OF THE INVENTION

1. Field of the Invention

The present invention relates to a photolithography process in a semiconductor process. More particularly, the present invention relates to a process for increasing a line width widow in a semiconductor process.

2. Description of the Related Art

With the increasingly higher demand for the level of circuit integration, circuit design is compelled to move forward in the direction of continuous reduction in the size of the components of an entire circuit. In the whole semiconductor process, the most decisive step is photolithography. Anything is related to metal-oxide-semiconductor (MOS) component structure, for example, the design of each layer of film and the areas with dopants, is decided by the photolithography step.

In addition, whether the component integration of the whole semiconductor industry can continue to advance to a line width less than 0.13 μm will also be decided by the technological development of the photolithography process. In order to meet this demand, processes for increasing photomask resolution, such as the process of optical proximity correction (OPC), are put forward constantly.

The object of OPC is to eliminate the phenomenon of critical dimension (CD) bias caused by proximity effect. The proximity effect occurs when a light beam projects on the wafer through the photomask pattern. On the one hand, because the light beam produces a scattering phenomenon, the light beam is enlarged; on the other hand, the light beam passes through the photoresist layer on the surface of the wafer and reflects from the semiconductor base of the wafer, and thus a phenomenon of interference is produced. Therefore, there are repeated exposures that change the actual amount of exposure on the photoresist layer. The smaller the critical dimension of the process is, the more obvious this phenomenon becomes, especially when the critical dimension is close to the wavelength of the light source.

When the pattern that is needed is an iso-line, the required exposure condition is different from the exposure condition for a dense-line pattern because there is no other pattern near the iso-line. Even for a dense-line pattern, if the line width duty ratio is different, the exposure condition required is different accordingly. Therefore, in processes under 0.13 μm, it is very difficult to compensate for the proximity bias produced by different patterns in order to achieve satisfactory development results.

Scattering bar is a process used for correcting and reducing proximity effect in the photolithography process. Bar-like patterns are formed along the periphery of the pattern on the photomask. When exposure is conducted, the light wave passes the scattering bar and scatters so that the proximity effect on the original design is eliminated.

Scattering bars are often used to correct the proximity effect on iso-line pattern. Usually, scattering bars are added on both sides of the iso-line pattern so as to make the exposure condition closer to that of the dense line. In this way, the process window for exposure conditions is enlarged. However, if the scattering bars are too wide, they cause positive photoresist to remain in the corresponding positions on the base. On the other hand, if the scattering bars are not wide enough, they do not sufficiently eliminate the proximity effect. Therefore, iso-line patterns often cause much limitation to the scope of exposure conditions.

SUMMARY OF THE INVENTION

One of the objects of the present invention is to provide a process for increasing a line width window in semiconductor process in order to solve the problem that occurs when an iso-line pattern and a dense line pattern undergo exposure at the same time.

Another object of the present invention is to provide a process for increasing a line width window, wherein scattering bars of sufficient size are added on both sides of the iso-line pattern to undergo the first exposure. Then, the corresponding parts of the scattering bars undergo a second exposure with a second photomask in order to eliminate the remaining photoresist at the positions corresponding to the scattering bars.

Based on the above described objects of the invention, a process for increasing the line width window of semiconductor process is provided, which process is suitable for increasing the photolithography line width widow at the time of the exposure of an iso-line pattern under 0.13 μm. This process includes: first forming a positive photoresist layer on the base and then using the first photomask to conduct the first exposure step on the positive photoresist layer. The first photomask is designed to have at least one opaque main line. On each of the two sides of the main line, there is an opaque scattering bar. The width of the two scattering bars is greater than one third of the wavelength of the light source being used, and less than the width of the main line. The second photomask is used to conduct the second exposure step on the positive photoresist layer. The second photomask is designed to have at least two iso-lines that are pervious to light, and each of the two iso-lines is located in one of the two positions corresponding to the two scattering bars of the first photomask design. The width of each iso-line is greater than that of the corresponding scattering bar and the distance from each edge of the iso-line to each edge of the corresponding scattering bar is greater than about 60 nm.

As is described above, the present invention uses scattering bars of sufficient size to eliminate the proximity effect during the main line exposure. It uses another exposure to solve the problem of photoresist remaining caused by the scattering bars. Therefore, the present invention can increase the line width widow and enables the process of fabrication to enter more easily into process under 0.13 μm.

BRIEF DESCRIPTION OF THE DRAWINGS

The objects described above and other objects, characteristics and advantages of the present invention will become clearer from a detailed description of the following preferred embodiment with reference to the accompanying drawings, wherein.

DESCRIPTION OF THE PREFERRED EMBODIMENTS

Figure 1:
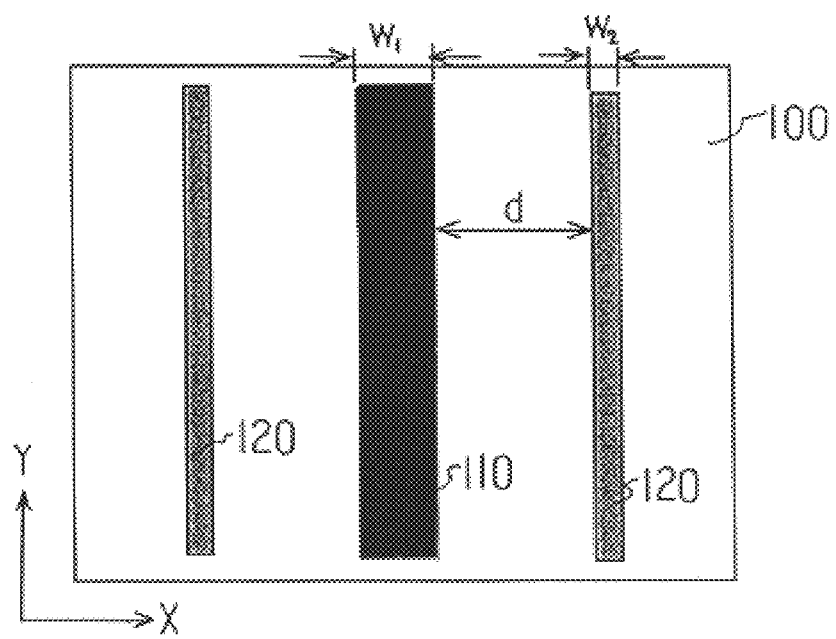
FIG. 1 is an OPC photomask design of an iso-line pattern.

Reference is made to FIG. 1. FIG. 1 shows the OPC photomask design for an iso-line design. On the photomask, there are a main line 110 and scattering bars 120 on both sides of the main line 110. Both the main line 110 and the scattering bars 120 are opaque and their widths are w1 and w2, respectively. The distance between the main line 110 and the scattering bars 120 is d. Because a positive photoresist is generally used, when the photomask of FIG. 1 is used for the first exposure, the photoresist of the part that is illuminated dissolves in the developer that is used afterwards.

Figure 2:
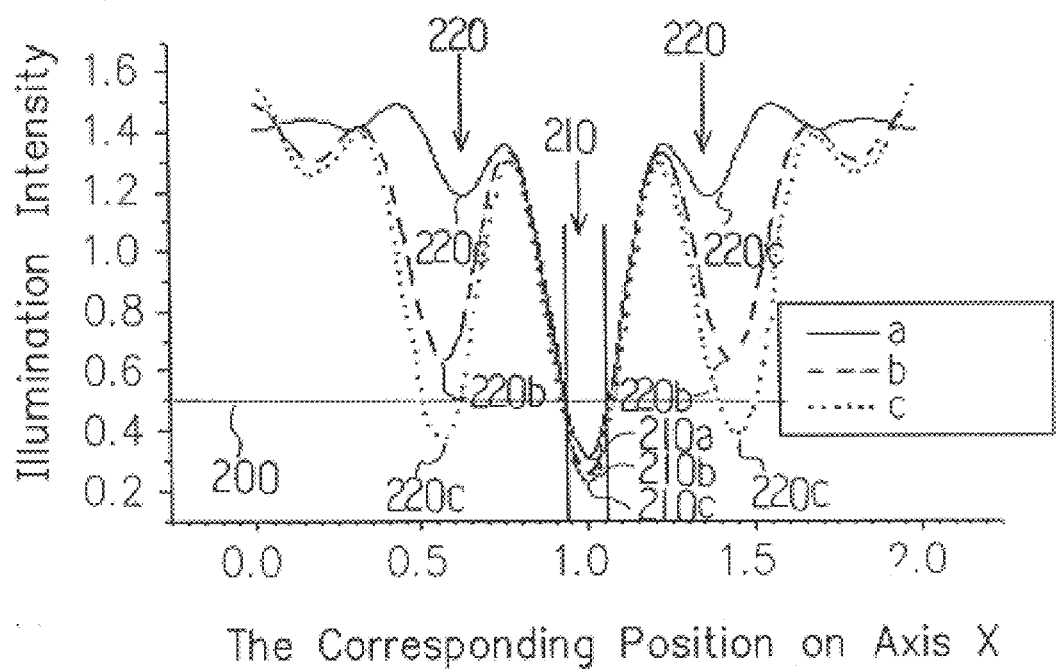
FIG. 2 is a distribution graph of the illumination intensity (vertical axis) on the X axis (horizontal axis) after the light wave of the light source passes through the photomask shown in FIG. 1.

Reference is made to FIG. 2. FIG. 2 is a distribution graph of the illumination intensity (vertical axis) on the X axis (horizontal axis) after the light wave of the light source passes through the photomask of FIG. 1. It can be seen from FIG. 2 that the illumination intensity should be higher than 0.5 of the critical line 200 so that the photoresist can dissolve into the developer. Otherwise, there will be residual photoresist after the development. In FIG. 2, the solid line (a), the dashed line (b) and the dotted line (c) are illumination intensity distribution curves caused respectively by the main line 110 only, the main line 110 and scattering bars with a width of about 60 nm (w2, see FIG. 1), and the main line 110 and the scattering bars with a width of about 100 nm (w2, see FIG. 1). The width (w1,see FIG. 1) of the main line 110 of the above described three curves is about 130 nm.

It can be discovered from the illumination intensity distribution curves of the three that at the wave bottoms 210a, 210b, 210c corresponding to the main line 110, the intensity reduces along with the increase of the width of the scattering bars 120 (210a>210b>210c), and the slope absolute values on both sides increase accordingly. This shows that when the width of the scattering bars 120 on both sides of the main line 110 increases, the contrast of illumination intensity at the edge of the main line 110 can be increased, thus the line width of the main line is more easily controlled.

Figure 3A:
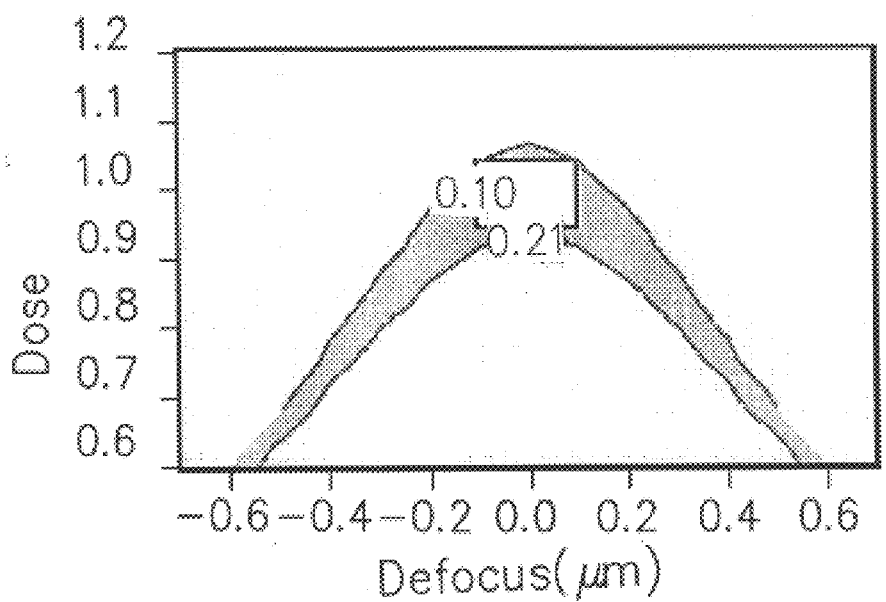
FIGS. 3A to 3C show the relation between illumination dose and the extent of defocus when the exposure is conducted separately on the photomasks of the main line only, the main line and the scattering bars having a width of about 60 nm and the main line having scattering bars whose width is about 100 nm.
Figure 3B:
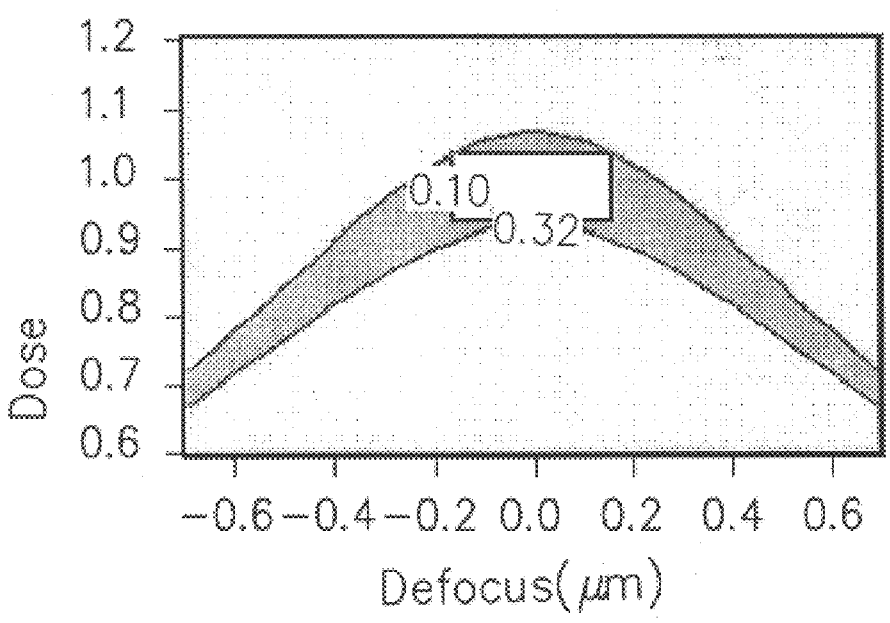
Figure 3C:
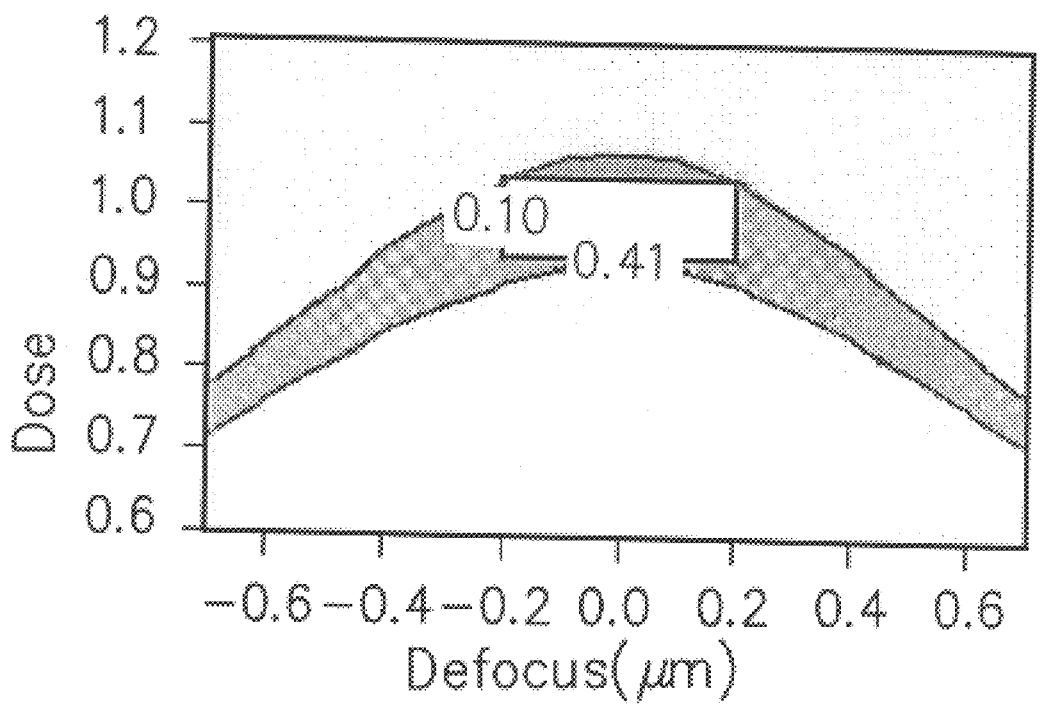

FIG. 3A to FIG. 3C show the relation between illumination dose and the extent of defocus when the photomasks of the main line only (FIG. 3A), the main line and scattering bars with a width of about 60 nm (FIG. 3B), and the main line and the scattering bars with a width of about 100 nm (FIG. 3C) are used separately to undergo exposure. The upper curve in each of the figures is received when the critical dimension of the received main line shifting pattern is about 143 nm, while the lower curve is received when the critical dimension of the received main line shifting pattern is about 117 nm.

It can be seen from FIGS. 3A to 3C that if the shifting pattern of the main line 110 whose critical dimension is about 130±13 nm is to be obtained, the main line 110 pattern on the mask 100 changes from one without scattering bars 120, to one with scattering bars 120 that are about 60 nm wide each, and then to one with scattering bars that are about 100 nm wide each, while the process window follows the change and increases from about 210 nm to about 320 nm and then to about 410 nm. Therefore, the scattering bars 120 not only increase the clarity of the shifting pattern of the main line 110, but also greatly increase the process width of the main line. When the exposure process window of the shifting pattern without scattering bars 120 is compared with the exposure process window of the shifting pattern that has about 100 $\mu$m wide scattering bars, the process window of the -latter is about 1.95 times that of the former. From the above described result, we discover that the preferred width of the scattering bars 120 is generally about ⅓ greater than the wavelength of the light source used and less than the width of the main line 110. Within the preferred width, the main line can have better exposure and development results.

However, in FIG. 2, the illumination intensity of the wave bottoms 220 that are on both sides of the wave bottom 210 reduces as the widths of the scattering bars 120 increase (220a>220b>220c), and the slope absolute values on both sides also increase. Especially when the width of the scattering bars is about 100 nm, the illumination intensity lowers to the level below the critical line 200. This means that after the development, in the positions corresponding to wave bottoms 220a, 220b, 220c (i.e. the positions corresponding to scattering bars 120), there will be remaining photoresist, as is shown in FIG. 4.

Figure 4:
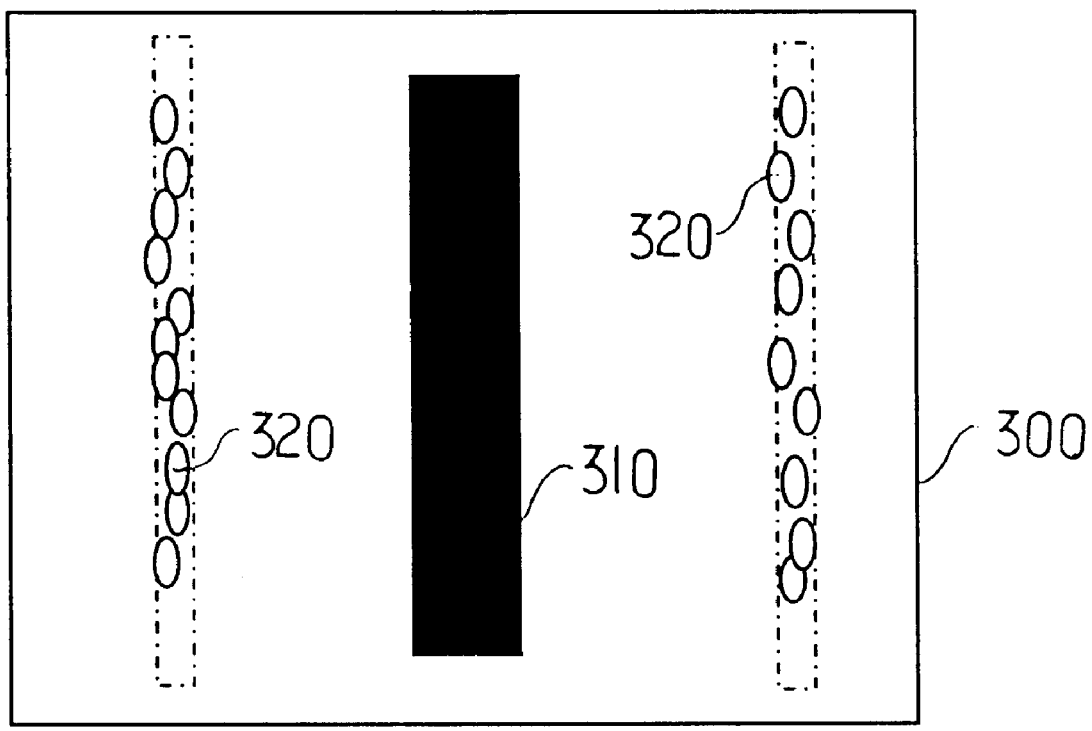
FIG. 4 shows the photoresist picture formed after the photoresist exposure and the development through the photomask shown in FIG. 1.

FIG. 4 is a photoresist picture formed after the photoresist exposure and development through the photomask in FIG. 1. The main line 310 on the base 300 shifts to the main line 110 on the photomask 100, and the remaining photoresist 320 on both sides of the main line is caused by the scattering bars 120 of the photomask 100. The scattering bars 120 are used to correct the proximity effect of the main line 110, but they bring the unwanted remaining photoresist 320. Therefore, another photomask should be used and another exposure should be conducted in order to eliminate the remaining photoresist.

Figure 5:
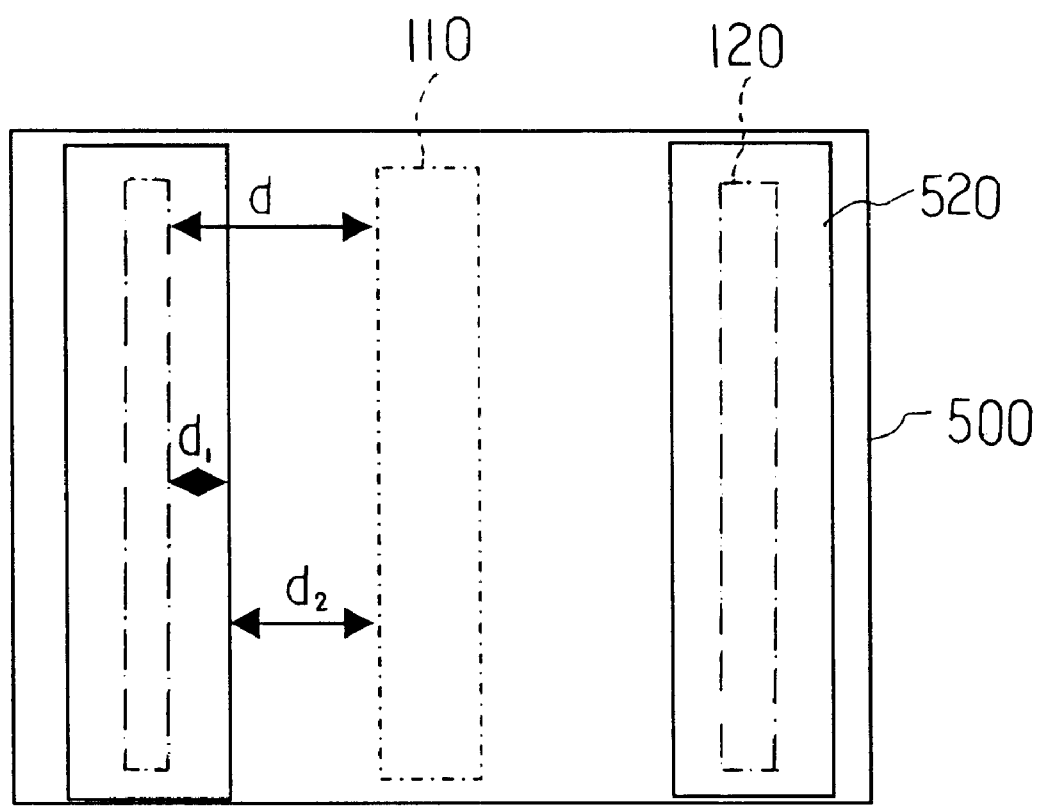
FIG. 5 is the photomask used for the second exposure.

FIG. 5 is the photomask 500 used for the second exposure. Here the corresponding positions and the size of the main line 110 on photomask 100 and the scattering bars 120 are also drawn with dashed lines for reference. From FIG. 5 we can see that there are two areas 520 on the photomask 500 that are pervious to light. The areas just cover the scattering bar 120 areas of the photomask 100 in FIG. 1. Thus, after the second exposure, the remaining photoresist 320 that is left by the scattering bars 120 can dissolve in developer so as to be eliminated.

On the photomask 500, the width of the transparent areas 520 is greater than that of the scattering bars 120, and the distance d1 between the longer sides of the two is preferably greater than about 60 nm. Preferably, dl is between about 80 and 100 nm. Therefore the distance d between the scattering bars 120 on the photomask 100 and the main line 110 is preferably greater than about 200 nm.

It can be seen from the preferred embodiment of the present invention described above that this invention makes use of sufficiently large scattering bars to eliminate the proximity effect during exposure of the main line. It then makes use of another exposure to solve the problem of residual photoresist caused by the scattering bars. Therefore, by using this invention, line width window can be increased and the process can enter more easily into the process having a line width under 0.13 $\mu$m so as to help the semiconductor process to advance into the next generation of technology.

Although the present invention has been disclosed above with a preferred embodiment, it is not limited by this embodiment. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for increasing a line width window of a semiconductor process, the method comprising:

forming a positive photoresist layer on a substrate;

using a first photomask to conduct a first exposure step on the positive photoresist layer, wherein the first photomask is designed to have at least one main line that is opaque, two scattering bars arc formed on each of two sides of the main line, respectively, and a width of each scattering bar is greater than one third of a wavelength of a light source used during exposure and less than a width of the main line so that proximity effects of the first exposure step is compensated; and using a second photomask to conduct a second exposure step on the positive photoresist layer, wherein the second photomask is designed to have at least two iso-lines, wherein the two iso-lines are located in two positions respectively corresponding to the two scattering bars of the first photomask, a width of each iso-line is greater than that of the corresponding scattering bar so that the positive photoresist layer is easily removed during a subsequent photoresist stripping process.

2. The method of claim 1, wherein a distance between the two scattering bars and the main line is greater than about 200 nm.

3. The method of claim 1, wherein a distance between the edge of each iso-line and the edge of each corresponding scattering bar is within a range of about 80 to 100 nm.

4. The method of claim 1, wherein when the line width of the main line is about 130 nm, a line width of each scattering bar is within a range of about 100 to 120 nm.

5. The method of claim 1, wherein a distance from each edge of the iso-line to each edge of the corresponding scattering bar is greater than about 60 nm.

6. A method for increasing a line width window of a semiconductor process, the method comprising:

forming a positive photoresist layer on a substrate;

using a first photomask to conduct a first exposure step on the positive photoresist layer, wherein the first photomask is designed to have at least one main line that is opaque, two scattering bars are formed on each of two sides of the main line, respectively, and a width of each scattering bar is greater than one third of a wavelength of a light source used during exposure so that proximity effects of the first exposure step is compensated; and using a second photomask to conduct a second exposure step on the positive photoresist layer, wherein the second photomask is designed to have at least two iso-lines that are pervious to light, the two iso-lines are located in two positions respectively corresponding to the two scattering bars of the first photomask, a width of each iso-line is sufficient to cover the corresponding scattering bar so that the positive photoresist layer is easily removed in a subsequent photoresist process.

7. The method of claim 6, wherein a distance between the two scattering bars and the main line is greater than about 200 nm.

8. The method of claim 6, wherein a distance between the edge of each iso-line and the edge of each corresponding scattering bar is within a range of about 80 to 100 nm.

9. The method of claim 6, wherein when the line width of the main line is about 130 nm, a line width of each scattering bar is within a range of about 100 to 120 nm.

10. The method of claim 6, wherein a distance from each edge of the iso-line to each edge of the corresponding scattering bar is greater than about 60 nm.

* * * * *